United States Patent [19]

Niggl et al.

[11] Patent Number: 4,752,861
[45] Date of Patent: Jun. 21, 1988

[54] HOUSING FOR THE ACCOMMODATION OF ELECTRICAL ASSEMBLY CARRIERS

[75] Inventors: Heinz J. Niggl, Poecking; Guenter Thom, Gauting, both of Fed. Rep. of Germany

[73] Assignee: Siemens Aktiengesellschaft, Berlin and Munich, Fed. Rep. of Germany

[21] Appl. No.: 98,841

[22] Filed: Sep. 21, 1987

[30] Foreign Application Priority Data

Sep. 30, 1986 [DE] Fed. Rep. of Germany ....... 3633273

[51] Int. Cl.$^4$ ............................................. H05K 7/20
[52] U.S. Cl. ................................... 361/383; 220/4 F;
206/821; 361/394; 361/415; 361/424
[58] Field of Search ................. 165/80; 220/4 D, 4 F,
220/23.6; 206/328, 504, 509, 821; 200/307;
361/382, 383, 386–388, 390, 391, 393–396, 399,
415, 424

[56] References Cited

U.S. PATENT DOCUMENTS

| | | |
|---|---|---|
| 3,288,301 | 11/1966 | Kent . |
| 3,718,218 | 2/1973 | Shields .............................. 206/504 |
| 3,966,285 | 6/1976 | Porch ................................ 220/4 F |
| 4,213,532 | 7/1980 | Eggert .............................. 206/504 |
| 4,251,853 | 2/1981 | Sites ................................. 361/393 |
| 4,652,969 | 3/1987 | Stegenga ........................... 361/399 |
| 4,700,275 | 10/1987 | Wood ................................ 361/415 |

FOREIGN PATENT DOCUMENTS

2842080 4/1980 Fed. Rep. of Germany .
8509591 5/1985 Fed. Rep. of Germany .

Primary Examiner—G. P. Tolin
Attorney, Agent, or Firm—Hill, Van Santen, Steadman & Simpson

[57] ABSTRACT

A housing consists of modular housing units 1 which can be stacked one above another and beside each other and which are provided with mechanically stable sidewalls 11. Between the sidewalls 11 of vertically adjacent housing units 1, a slot is formed which takes up variations and irregularities in the adjacent sidewall edges and permits mechanically stable connection and simultaneous electrical connections to laterally adjacent housing units 1. The housing does not have a separate frame for the accommodation of the circuit boards. Horizontal locking plates 12 connect the sidewalls 11 and provide both guide rails for the circuit boards and cooling openings.

12 Claims, 5 Drawing Sheets

HOUSING FOR THE ACCOMMODATION OF ELECTRICAL ASSEMBLY CARRIERS

BACKGROUND OF THE INVENTION

1. Field of the Invention

This invention relates to a housing for mounting electrical assembly carriers such as circuit boards. The housing is formed of modular, parallelepiped-shaped housing units which can be stacked one above another on a base member and have strong and mechanically stable sidewalls. Horizontal attaching members extend between the upper and lower edges of the sidewalls, parallel to the base surface, and the electrical assemblies are detachably arranged, between holding elements mounted in planes which are parallel to the sidewalls.

2. Description of the Prior Art

German Utility Model No. G 8 509 591.5 describes a frame for mounting electrical assembly carriers which consists of a plurality of individual units which can be stacked one above another. The units are provided with mechanically stable sidewalls which are connected to each other at the top and bottom by assembly carrier cross-members which extend at right angles. The known frame is formed by directly positioning the units one above another without the provision of special connecting elements between adjacent units. Housings composed to a plurality of units stacked one above another without special connecting elements are mechanically unstable, in particular when the center of gravity of the overall arrangement is far above the base surface of the housing.

U.S. Pat. No. 3,288,301 shows a printed circuit card frame which is formed of interlocking panels.

German Pat. No. 28 42 080 a locking pin arrangement for panels.

SUMMMARY OF THE INVENTION

An object of the present invention is to provide a housing for printed circuit boards which has good mechanical stability even when a number of housing units are stacked one above another. A further object is to provide a housing which can be mechanically connected to laterally adjacent, identical housings in a simple fashion.

According to the present invention, a housing for a plurality of circuit boards, composed of modular, parallelepiped-shaped housing units which can be stacked one above another on a base surface and which are provided with mechanically stable sidewalls are connected to one another by horizontal fixing plates which extend along the upper and lower edges of each modular unit in planes which are parallel to the base surface. Between the plates the circuit boards are detachably mounted in planes parallel to the sidewalls and the sidewalls have accommodating recesses for the circuit boards which are designed in a manner such that rigid connecting elements can be inserted into mating recesses of two adjacent housing units. The mechanically rigid connecting elements are each provided with a spacer so as to form a space of substantially constant width between adjacent housing units.

The invention has the advantage that housing units can be arranged one above another even though there are variations and irregularities in the edges of the adjacent sidewall. The slots are formed between the edges of the sidewalls of the housing units which are arranged one above another and compensate for any disconformity between the edges of the sidewalls. Furthermore, the slots permit identical housings, arranged side by side, to be connected in a mechanically stable fashion without requiring that openings be drilled into the sidewalls for screw or bolt connections. Laterally adjacent housings can be easily separated from one another when desired, without leaving evidence of the prior connection.

The slots also give the housing an attractive appearance. Thus, in addition to the many mechanical functions, they also have a decorative appeal.

The housing of the invention does not have a separate frame for the assembly carriers. The sidewalls perform the function not only of the assembly carrier frame, but also are the housing walls for electrical devices, and also provide screening from external voltages and also provide protection from mechanical damage and from dust and pollution. The invention results in compact and economic housings.

Housing units which are stacked one above another and/or are mounted laterally adjacent to each other are connected together by the same connecting elements, and are mechanically stable and also provide electrical continuity. The housing which consists of a plurality of units can be connected to ground at only one location so as to screen all the assemblies mounted in the housing. If the housing is subsequently modified by adding additional housing units at the top or sides these can be connected mechanically and electrically during assembly, and therefore a separate connection to ground does not need to be provided.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure, and in which:

DESCRIPTION OF THE PREFERRED EMBODIMENTS

Figure 1:
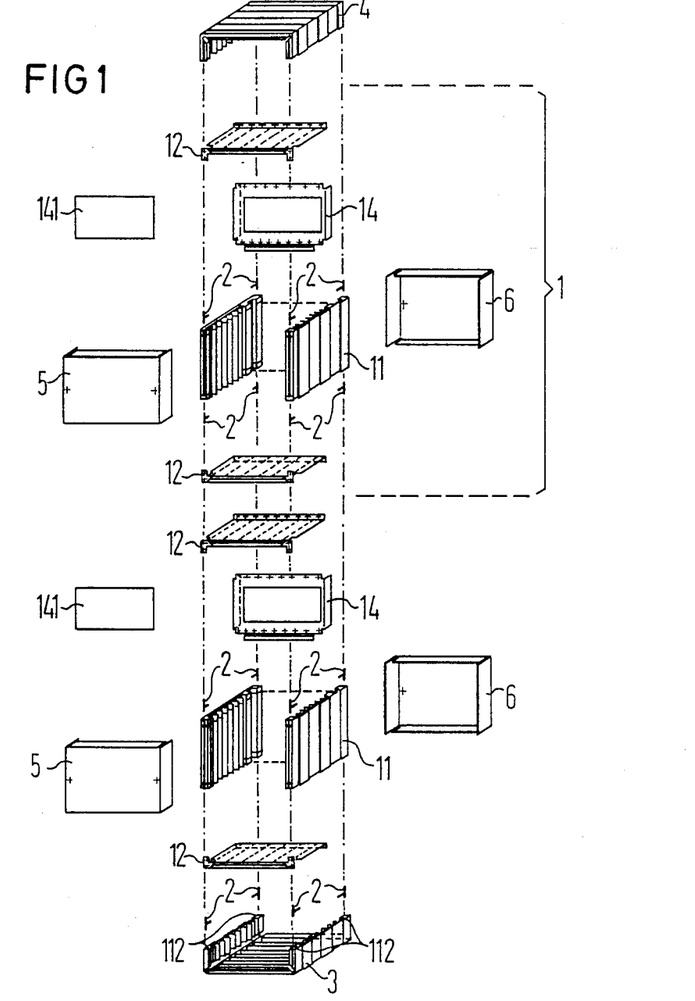
FIG. 1 is an exploded view of a housing formed of two modular housing units.

FIG. 1 illustrates the housing for mounting electrical assembly carriers for printed circuit boards and comprises modular housing units 1 which have mechanically strong and stable sidewalls 11, a lower housing cover 3 and an upper housing cover 4. The complete housing can be constructed from a plurality of modular housing units 1. FIG. 1 shows a housing comprising two modular housing units 1, which are stacked above each other and which are interconnected by first mechanically rigid connecting elements 2.

Figure 2:
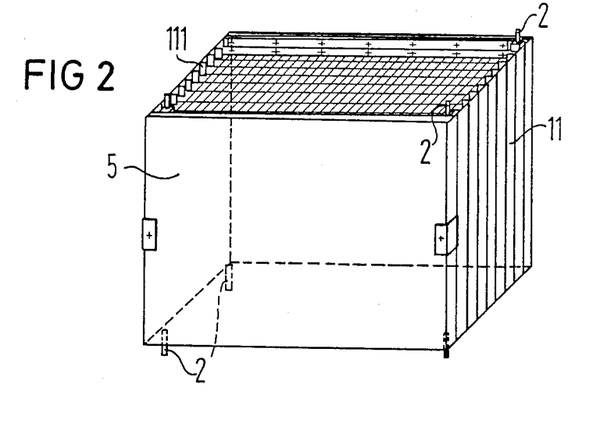
FIG. 2 is a perspective view of one housing unit.
Figure 3:
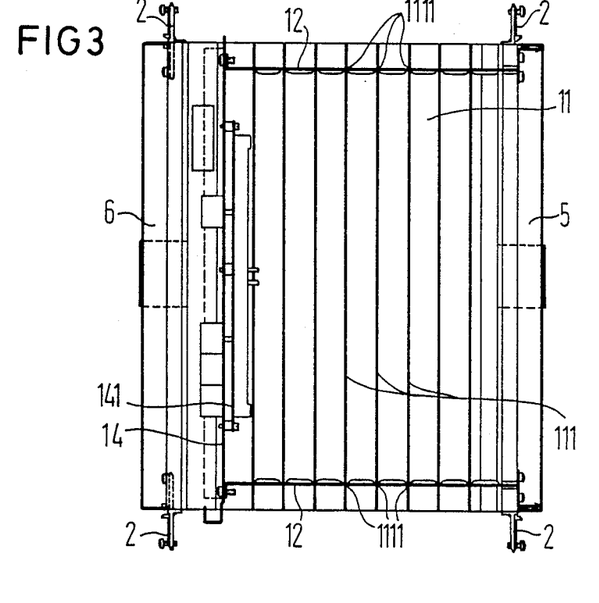
FIG. 3 is a view of the interior of a unit and shows a sidewall of the housing unit.

The sidewalls 11, which are also shown in FIGS. 2 and 3 and are of a mechanically stable design and are formed at least partially and preferably entirely of electrically conductive material. The sidewalls 11 screen the electrical assemblies which are mounted inside the housing units and the sidewalls are connected to ground. So as to increase their mechanical stability, the sidewalls 11 are provided with reinforcing elements 111 or are corregated. Ribs which extend along the inner wall of the housing and in the stacking direction can be used for this purpose.

The sidewalls 11 can be permanently connected to each other by horizontal fixing elements which extend horizontally at right angles to the stacking direction, and which are in parallel to the base of the housing. The horizontal fixing elements may be plates 12. For the housing units 1 it is preferable to use plates 12 which are provided with guide rails 121 in which planar circuit boards which carry electrical assemblies can be mounted. The horizontal fixing elements or plates 12 are formed at least partially, and preferably entirely, of electrically conductive material. The reinforcing elements 111, which are formed by ribs which are aligned in the stacking direction, are provided in the vicinity of the upper and lower edges of the sidewalls 11 with horizontal cut-outs 1111 which allows the plate 12 to fit therein.

The housing of the invention does not have a separate frame and the sidewalls which are mechanically stable and strong form the frame. In the case of conventional housings for electrical equipment which have a separate frame, a space usually exists between the frame and the housing walls which can be used for cooling purposes. In the present invention, however, no separate cooling space is provided. The horizontal fixing elements are provided with cooling openings 122 which, in combination with openings formed in the upper and lower housing covers 3, 4, allow hot air to flow out of the housing and allows cool fresh air to flow into the housing. The cooling openings are formed in the lower and upper housing covers 3, 4 and are preferably arranged on the rear face of the housing relative to plane of the drawing of FIG. 1. First and second grills provided with cooling openings can be inserted into the lower and upper housing covers 3, 4 respectively.

The fronts of housing units 1 are closed by a front wall plate. A rear wall plate 14 is mounted at the position indicated by horizontal broken lines between the sidewalls 11 in the vicinity of their rear edges. The rear wall plate 14 is connected to a wiring board 141 as shown in FIG. 3 and on its side facing towards the interior of the housing, is provided with contact elements which electrically contact the electrical assemblies. A free space for the storage of cables is provided between the rear wall plate 14 and the edges of the sidewalls 11.

Figure 8:
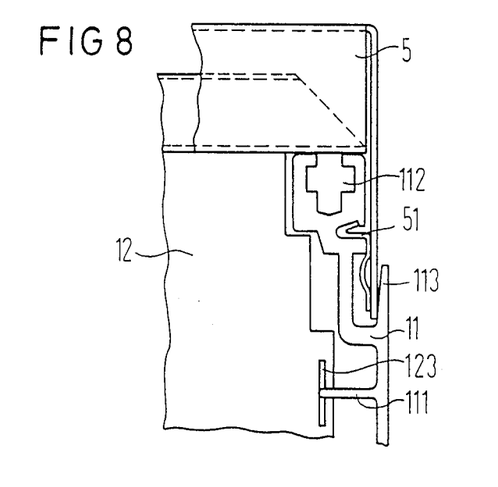
FIG. 8 is a plan view of an edge of a housing unit and shows a connecting element mounted in a sidewall.
Figure 9A:
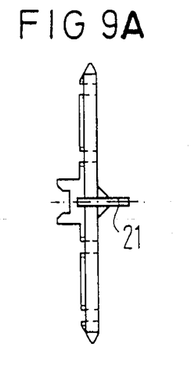
FIGS. 9a, 9b and 9c are plan views showing a first connecting element for connecting two housing units mounted above each other.
Figure 9B:
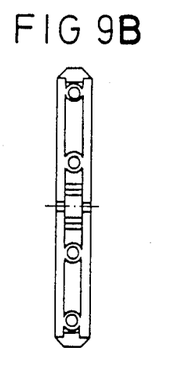
Figure 9C:
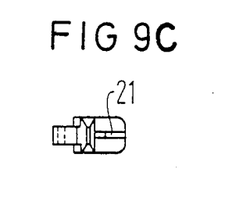

As shown in FIGS. 8, 9a, 9b and 9c, the sidewalls 11 are provided with locking recesses 112 which are formed so that the rigid connecting elements 2 shown in FIGS. 9a, 9b and 9c can be received into the recesses 112. The connecting elements 2 have a central flange 21 and two arms having a "T" shaped cross-section which extend in a direction which is perpendicular to the flange 21 and in opposite directions. The connecting elements 2 are designed such that between adjacent stacked housing units 1 a slot of substantially constant width is formed. The connecting elements 2 can also be used to connect the upper and lower housing covers 3 and 4 to the stacked housing units 1, since the housing covers 3 and 4 are also provided with aligned locking recesses 112 into which the connecting elements 2 can be received.

The locking recesses 112 are formed adjacent the four corners of the housing. The locking recesses 112 are formed by cruciform-shaped channels which extend in the vertical direction. The two elongated arms of the first connecting elements 2 in the assembled state project respectively either into one of two adjacent housing units 1, or into the lower housing cover 3 and its adjacent housing unit 1, or into the uppermost housing unit 1 and the upper housing cover 4. The overall length of the first connecting elements 2 is such that it preferably corresponds to the height of the sidewalls 11, and more or less of one half of the connecting element extends into one sidewall 11 and the other half of the connecting element 2 extends into the other sidewall. However, the requisite mechanical stability is provided even when the first connecting elements 2 are shorter. It is preferable to use identical connecting elements 2 for assemblying the entire housing. As shown in FIG. 1, the lower and upper housing covers 3, 4 may have heights which are less than the heights of the sidewalls 11. If the same connecting elements 2 are used for the entire housing, the length of the first connecting elements 2 is at most twice the height of the lower and upper housing covers.

The mechanical stability required for the housing is achieved even with only three first connecting elements 2 mounted between respective adjacent pairs of housing units 1 and between a housing unit 1 and its adjacent housing cover 3 or 4.

Figure 10A:
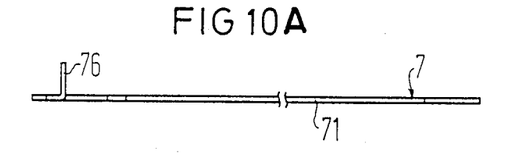
FIGS. 10a, 10b and 10c are plan views showing a second form of a connecting element for connecting laterally adjacent housing units.
Figure 10B:
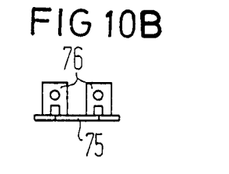
Figure 10C:
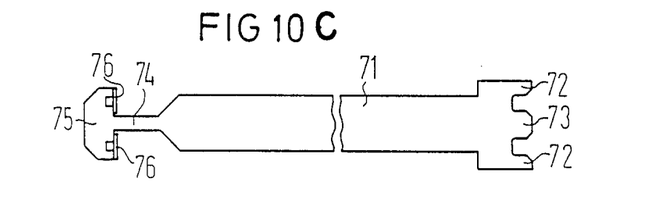

The first connecting elements 2 are shown in detail in FIGS. 9a, 9b and 9c and are provided with a central spacer. The spacers ensure that slots of substantially constant width are formed between adjacent stacked housing units 1, as well as between the lower and upper housing covers 3, 4 and the adjacent housing units 1. The slots have several functions such as irregularities in the adjacent sidewall edges of the stacked housing units are less apparent, and any large variations can be compensated for by using spacers having different heights. Additionally, the slots can be used to mechanically connect laterally adjacent housings, by inserting second connecting elements 7 into slots which are arranged directly beside one another in laterally adjacent housings. The second connecting elements which are shown in FIGS. 10a, 10b and 10c internally grip the sidewalls of laterally adjacent housings. The second connecting elements 7, are elongated planar members having a main portion 71 and have an enlarged first end formed in the shape of a fork. The fork has two outer prongs 72, and a third, central spring 73. At the second end remote from the fork, the main portion 71 narrows to form a tongue 74. At the end of the tongue 74 there is an enlarged portion 75 from which tabs 76 extend upwardly.

The lower and upper housing covers 3, 4 and the sidewalls 11 are preferably formed from the same material, and have identical interior and exterior profiles. They are produced by moulding and the sidewalls 11 can be advantageously produced by extrusion moulding.

Each housing unit 1 is closed at its front and rear by a front cover 5 and rear cover 6, respectively. The covers 5, 6 can preferably be held in place by snap-lock connections, as shown in FIG. 8.

Figure 4:
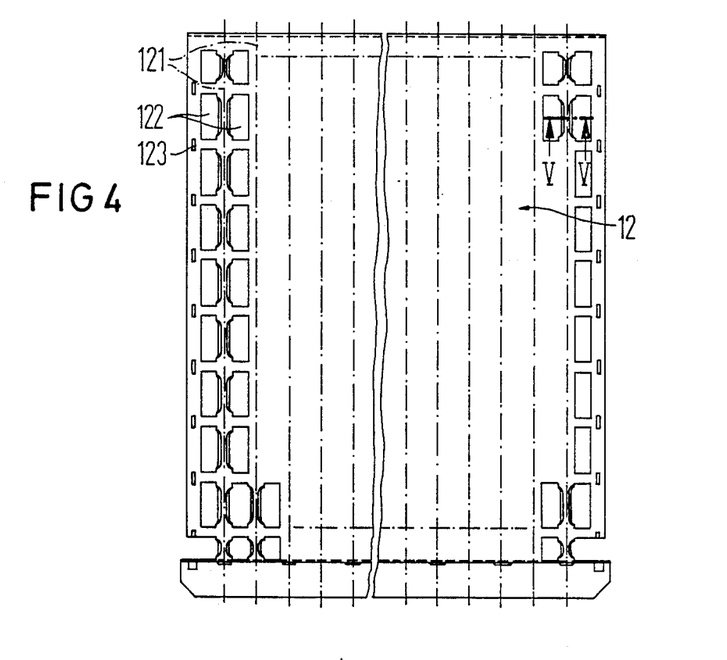
FIG. 4 shows one of the plates which extend between the sidewalls adjacent their upper and lower edges.

FIG. 2 is a perspective view of an assembled housing unit 1. First connecting elements 2 are inserted into locking recesses 112 formed in the upper and lower edges of the sidewalls 11. The housing unit 1 is closed at its front and rear by a front cover 5 and a rear cover 6 which is not visible in FIG. 2. The top of the housing unit 1 is closed by a plate 12 which, as will be explained in relation to FIG. 4, is provided with circuit board guide rails which extend parallel to the sidewalls 11 and is also provided with cooling openings. The side edges of the plate 12 are mounted in horizontal cut-outs formed in the reinforcing elements 111 of the sidewalls 11.

FIG. 3 shows the sidewall 11, the upper and lower plates 12, the rear wall plate 14, the front and the rear covers 5, 6 and the first connecting elements 2, in their assembled condition.

On the inside face of each sidewall 11, reinforcing elements 111 extend in the vertical direction, which is at right angles to the base surface of the housing. The plates 12, which are provided with guide rails for the insertion of circuit boards, are permanently mounted in horizontal cut-outs 1111 formed in the reinforcing elements 111 of the sidewalls 11. The circuit boards are inserted from the front of the housing which is the right-hand side as seen in FIG. 3 until they engage the wiring board 141 which is secured to the rear wall plate 14. Plug connecting strips, which are open towards the front of the housing unit 1, are attached to the wiring board 141. These plug connecting strips are provided with contact pins which engage in pin receiving elements on the circuit boards. The plug connecting strips of a housing unit 1 can be connected to each other and to the plug connecting strips of other housing units by cables (not shown) which extend into the rear area of the housing units which are limited by the rear wall plates.

The housing unit 1 shown in FIG. 3 is closed by a front cover 5 at its front which is the right side, and by a rear cover 6 at its rear side.

The first connecting elements 2 are inserted into recesses 112 formed in the upper and lower edges of the sidewall 11, so as to connect it either to a further sidewall 11 of a vertically adjacent housing unit 1, or to the lower and/or upper housing cover 3, 4.

FIG. 4 shows the plate 12, and the arrangement of the guide rails 121 for the electrical assembly carriers and the cooling openings 122. The cooling openings 122 are arranged in rows which extend parallel to the sidewalls 11, and are provided with raised lip 1221 which project towards the interior of the assembled housing unit 1 and which are shaped in a manner such that the lips 1221 of adjacent rows define a guide channel 121. The shape of the lips 1221 are shown in FIGS. 5 and 6.

At the edges of the plate 12 which is to be connected to the sidewalls 11, the plate 12 is provided with embossments 123 so as to establish an electrical connection between the plate 12 and the sidewalls 11 because they make contact and press into the horizontal cut-outs 111 (FIG. 3) against the reinforcing elements 111. The shape of the embossments are shown in FIG. 7.

Figure 5:
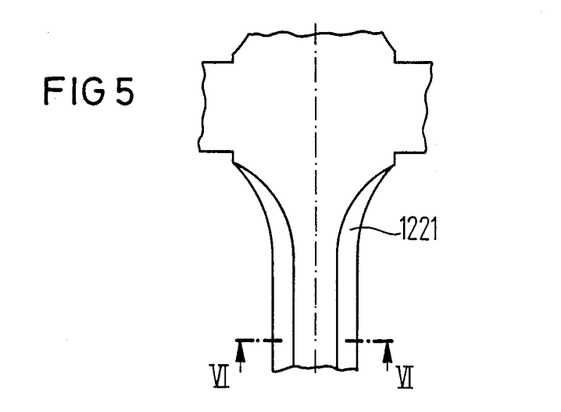
FIG. 5 is a sectional view through the plate shown in FIG. 4 taken on line V—V.
Figure 6:
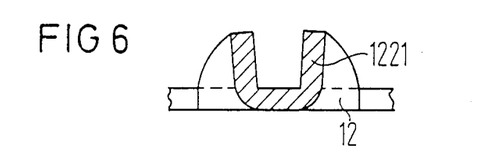
FIG. 6 is a sectional view through the plate taken on line VI—VI of FIG. 5.

FIGS. 5 and 6 illustrate one possible shape for the lips 1221. The lips 1221 are formed on the plate 12, prior to the formation of the cooling openings 122, by forming a slit which is parallel to the guide rails and by bending the plate material adjacent the slit at right angles to the plate. The two lips 1221 shown in FIG. 5 consist of material originally situated between two adjacent cooling openings in neighbouring rows. The lips 1221 of adjacent rows of the cooling openings form the sidewalls of guide channels for the circuit boards, and the width of the channel tapers toward the plate 12. The circuit boards are each supported in a channel formed by the lips 1221 of two adjacent rows of cooling openings 122. The tapering of the channel ensures that firm mounting of the circuit boards occurs.

Figure 7A:
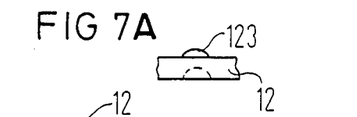
FIG. 7 illustrates further structural details of the plate shown in FIG. 4.
Figure 7B:
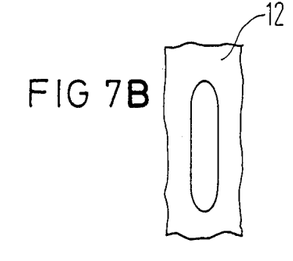
Figure 7C:
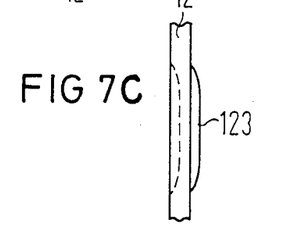

FIG. 7 shows the shape of the embossments 123 which are formed in the plate 12. The embossments 123 are elongate, and are arranged parallel to the sidewalls 11 of the housing unit 1. Sidewalls 11 and plate 12 consist at least partially of an electrically conductive metal layer. The embossments 123 establish an electrical connection between the electrically conductive layers of the two components. The embossments 123 on the plate 12 are received in the horizontal cut-outs 1111 of the reinforcing elements 111. The shape of the embossments 123 is such that electrical contact is established independently of the tolerances in the horizontal cut-outs 1111 and/or the plate 12. When the housing unit is grounded, the electrical assemblies therein are screened from external voltages.

The screening is effected by the sidewalls 11, the upper and lower plates 12, and the rear wall plate 14 in combination with the wiring board 141. The screening can be supplemented by grounded conductive front and rear covers 5, 6, respectively, and by grounded conductive lower and upper housing covers 3, 4, respectively.

FIG. 8 illustrates a sidewall 11, which is provided with a locking recess 112, a horizontal plate 12 and a front housing unit cover 5. The plate 12 is inserted into cut-outs in the reinforcing elements 111 which extend at right angles to the vertical direction. The embossments 123 ensure the firm mounting of the plate 12 and ensure an electrical contact between the plate 12 and the sidewall 11.

The locking recess 112 is formed directly at the edge of the sidewall 11, and comprises an undercut channel which extends in the vertical direction and which is open towards the outside of the housing unit 1. This allows the first connecting element 2, illustrated in FIGS. 9a 9b and 9c, to be fixed into position by a screw which extends through an opening formed in the first connecting element and which clamps the edges of the channel between the screw head and the connecting element. The length of the channel is at least equal to one half of the length of the first connecting element 2. Preferably the channel extends over the entire vertical heights of the housing unit 1.

The front and rear covers 5, 6 are held in place by spring elements 51 which are mounted in the sidewall 11, and clamp an edge portion of the cover against a flange portion 113 of the sidewall.

FIGS. 9a, 9b and 9c are a cross-section, a front view and a plan view of a first connecting element 2. The connecting element 2 is symmetrical about the plane of the flange 21. The connecting element 2 is mechanically stable and electrically conductive, and provides the necessary mechanical stability and electrical continuity between the stacked housing units 1. The cross-section of the arms of the connecting element 2 corresponds to the cross-section of the locking recess 112 illustrated in FIG. 8, so that two adjacent housing units 1, are connected by having the arms of four connecting elements 2 inserted in their respective aligned pairs of recesses 112, and are mechanically stable.

At right angles to its longitudinal axis, the first connecting element 2 is provided at its center with an integral spacer flange 21. This spacer flange 21, together with the spacer flanges 21 of other connecting elements 2 which are arranged either on the upper side or the lower side of a housing unit 2, ensures that a slot of fundamentally constant width exists between vertically adjacent sidewalls 11 of stacked housing units 1.

The first connecting element 2 is also provided with openings for fixing screws. The connecting element illustrated in FIGS. 9a, 9b and 9c contains four such openings. The fixing screws may either engage threads in the openings of the fixing elements to clamp them in position in the accommodating recesses 112, or captive nuts may be used which are mounted so as to be restrained from rotating by the recess 112.

FIG. 10 shows a second connecting element 7 which is used to connect mechanically and electrically two horizontally adjacent housing units 1. In the assembled state the first connecting elements 2 of two adjacent housing units 1 are inserted into the locking recesses 112, and are arranged to extend respectively between an outer prong 72 and the central prong 73 of the second connecting element.

At the end opposite the fork-shaped end the element 7 tapers to form a tongue 74, the width of which is equal to the distance between adjacent housing units. An enlarged portion 75, which adjoins the tongue 74, has two upstanding fixing elements 76 which can be inserted into the channel-like accommodating recesses 112 and fixed therein using screws in the same manner as the first connecting elements 2 are fixed.

Like the first connecting elements 2, the second connecting elements 7 are electrically conductive so as to provide screening of the circuit boards from external voltages.

Figure 11:
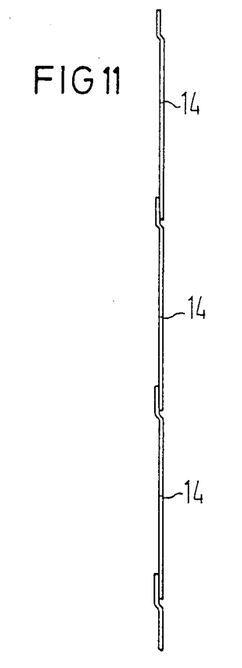
FIG. 11 is a schematic illustration showing rear wall plates for housing units stacked above each other.

FIG. 11 is a view at right angles to the planes of the sidewalls 11 showing the formation of the rear wall plate 14 and the co-operation between a plurality of rear wall plates 14 of housing units 1 stacked above each other. The rear wall plate 14 forms a mechanically stable connection with the rear wall plates 14 of adjacent housing units 1. At its upper and lower edges, the rear wall plate 14 of each housing unit is joined to the rear wall plate 14 of the housing unit 1 arranged above and below, for example, by screws. The rear wall plates preferably consist of electrically conductive material, and when connected to ground, screen the circuit boards arranged inside the housing units 1 from external voltages.

The components which are interconnected to form a housing unit and also the housing units which are interconnected to form the housing in accordance with the invention are both mechanically stable and electrically connected over the largest possible area. The electrically connected components form a comprehensive system for screening the housing interior from external voltages.

Although the invention has been described with respect to preferred embodiments, it is not to be so limited as changes and modifications can be made which are within the full intended scope of the invention as defined by the appended claims.

We claim as our invention:

1. A housing containing a plurality of circuit boards comprising, modular, parallelepiped-shaped housing units which are stacked above each other on a base surface and which are provided with mechanically stable sidewalls connected to one another by horizontal fixing plates which extend along the upper and lower edges of each modular unit in planes parallel to the base surface, and between the plates the circuit boards are detachably arranged in planes parallel to the sidewalls, said sidewalls are provided with locking recesses which are designed in a manner such that rigid connecting elements are located in the locking recesses of two adjacent housing units, the mechanically rigid connecting elements being each provided with a spacer so as to form a slot of substantially constant width between adjacent housing units wherein the sidewalls are provided with reinforcing elements which extend along the interior face in the vertical direction, and which are connected to the horizontal fixing plates in the region of the upper and lower edges of the sidewalls, wherein the region of the upper and lower edges of the sidewalls of the reinforcing elements are each provided with a horizontal cut-out which accommodates an edge portion of a respective horizontal fixing plate.

2. A housing unit as claimed in claim 1, wherein said accommodating recesses are arranged in the region of the four corners of the housing unit.

3. A housing as claimed in claim 1 wherein the sidewalls consist at least partially of an electrically conductive metal layer.

4. A housing as claimed in claim 1, wherein the horizontal fixing plates are at least partially covered by an electrically conductive metal layer.

5. A housing as claimed in claim 4, wherein the metal layers of the sidewalls and the metal layers of the horizontal fixing plates are electrically connected to one another.

6. A housing as claimed in claim 5, wherein the horizontal fixing plates are provided with embossments which press against the sides of the cut-outs in the reinforcing elements of the sidewalls and establish electrical contact between horizontal fixing plates and sidewalls.

7. A housing as claimed in claim 1, wherein the housing units each have a rear wall plate which is mechanically and electrically connected to the rear wall plate of adjacent housing units.

8. A housing as claimed in claim 7, wherein at its upper and lower edges, respectively, the rear wall plate of each housing unit is joined to the rear wall plates of the housing units mounted above and below it.

9. A housing as claimed in claim 1 wherein second connecting elements are inserted into adjacent slots in said housing units which are positioned side by side so as to mechanically and electrically connect the housing units.

10. A housing as claimed in claim 1, wherein the horizontal fixing plates each consist of a plate which is provided with guide rails and cooling openings.

11. A housing as claimed in claim 10, wherein the cooling openings are arranged in rows parallel to the sidewalls and are provided with lips which extend towards the interior of the housing unit and which are shaped such that the lips of adjacent rows of cooling openings form a guide channel therebetween.

12. A housing as claimed in claim 11, wherein two lips of adjacent rows of cooling openings form a channel which is arranged at right angles to the plate and which tapers in towards the plate.

* * * * *